(12) United States Patent
Kang et al.

(10) Patent No.: US 10,613,659 B2
(45) Date of Patent: Apr. 7, 2020

(54) DISPLAY DEVICE HAVING INTEGRATED TOUCH SENSITIVE ELEMENTS AND METHOD OF FABRICATION

(71) Applicant: Samsung Display Co., Ltd., Yongin-si, Gyeonggi-do (KR)

(72) Inventors: Young Gu Kang, Yongin-si (KR); Yang Hee Kim, Yongin-si (KR); Hong Jo Park, Yongin-si (KR); Su Jin Lee, Yongin-si (KR); Jong Hwan Lee, Yongin-si (KR); Hyun Hwan Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 158 days.

(21) Appl. No.: 15/445,665

(22) Filed: Feb. 28, 2017

(65) Prior Publication Data
US 2017/0269750 A1 Sep. 21, 2017

(30) Foreign Application Priority Data

Mar. 18, 2016 (KR) ........................ 10-2016-0032783

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13338* (2013.01); *G02F 1/13439* (2013.01); *G02F 1/136286* (2013.01); *G06F 3/0416* (2013.01); *H01L 27/124* (2013.01); *G02F 2001/134372* (2013.01); *G02F 2001/136231* (2013.01); *G02F 2001/136236* (2013.01); *G06F 2203/04103* (2013.01)

(58) Field of Classification Search
CPC ..... G02F 1/13338; G02F 2001/134372; G02F 2001/136231; G02F 2001/136236; G02F 1/13439; G02F 1/136286; G06F 3/0412; G06F 2203/04103; G06F 3/0416; H01L 27/124
See application file for complete search history.

(56) References Cited

U.S. PATENT DOCUMENTS

2006/0146255 A1 7/2006 Ahn
2008/0012011 A1 1/2008 Song et al.
(Continued)

OTHER PUBLICATIONS

Extended European Search Report for Application No. 17161018.1, dated Jul. 20, 2017, pp. 1-9.
(Continued)

*Primary Examiner* — Bryan Earles
(74) *Attorney, Agent, or Firm* — Innovation Counsel LLP

(57) ABSTRACT

A display device includes a display element including a first electrode, a protective layer arranged on the first electrode, a second electrode arranged on the protective layer at a pixel area and contacting a thin film transistor. A sensing line is arranged on the protective layer and contacts the first electrode through a contact hole exposing the first electrode through the third protective layer. The sensing line comprises a first conductive layer arranged on the protective layer and contacting the second electrode through the contact hole, and a second conductive layer arranged on the first conductive layer.

11 Claims, 8 Drawing Sheets

(51) Int. Cl.
*G02F 1/1362* (2006.01)
*G02F 1/1343* (2006.01)
*G02F 1/1333* (2006.01)

(56) References Cited

U.S. PATENT DOCUMENTS

| | | |
|---|---|---|
| 2014/0118292 A1 | 5/2014 | Kim |
| 2015/0103265 A1 | 4/2015 | Kim et al. |
| 2015/0220174 A1 | 8/2015 | Mu et al. |
| 2016/0027808 A1 | 1/2016 | Kim |
| 2016/0187695 A1* | 6/2016 | Cho .................... G02F 1/13338 349/12 |

OTHER PUBLICATIONS

European Communication corresponding to European Patent Application No. 17161018.1 dated Feb. 20, 2019, 9 pages.

* cited by examiner

DISPLAY DEVICE HAVING INTEGRATED TOUCH SENSITIVE ELEMENTS AND METHOD OF FABRICATION

RELATED APPLICATIONS

This application claims priority to, and the benefit of, Korean Patent Application No. 10-2016-0032783 filed on Mar. 18, 2016 in the Korean Intellectual Property Office, the entire contents of which are incorporated herein by reference in their entirety.

BACKGROUND

1. Field

An aspect of the present disclosure relates generally to display devices. More specifically, aspects of the present disclosure relate to display devices having integrated touch sensitive elements and their manufacture.

2. Description of the Related Art

A display device including a touch screen integrated into a display panel has been developed. The touch screen is one of many information input devices. In operation, a user inputs information by pressing or touching the touch screen while viewing an image created in the display panel.

Recently, low-profile display devices with an integrated touch screen have been developed for slimming of a portable terminal such as a smart phone, a tablet PC, etc. ongoing efforts exist in this regard.

SUMMARY

According to an aspect of the present disclosure, there is provided an integrated touch screen display device in which constituent elements of the touch screen are arranged in the display panel.

According to another aspect of the present disclosure, there is provided a method of fabricating the display device.

According to an embodiment, a display device may include a first substrate including a base substrate comprising a plurality of pixel areas, a thin film transistor arranged at each pixel area on the base substrate, a first protective layer arranged on the thin film transistor, and a second protective layer arranged on the first protective layer, a second substrate facing the first substrate, a display element including a first electrode arranged on the second protective layer, a third protective layer arranged on the first electrode, a second electrode arranged on the third protective layer at one of the pixel areas and contacting the corresponding thin film transistor through a first contact hole and an optical layer configured to selectively transmit and block light by an electric field generated by the first electrode and the second electrode, the optical layer arranged between the first substrate and the second substrate, and a sensing line arranged on the third protective layer and contacting the first electrode through a second contact hole, wherein the sensing line comprises a first conductive layer arranged on the third protective layer and contacting the second electrode through the second contact hole and a second conductive layer arranged on the first conductive layer.

The first conductive layer may include conductive metal material, the second conductive layer may cover the first conductive layer and the second conductive layer may include a same material as the second electrode The first electrode may have an undercut, so that an edge of the first electrode may be spaced apart from an edge of the third protective layer, and an area of the first electrode may be smaller than an area of the third protective layer.

The second electrode may extend along a side wall of the first contact hole, and a distance between the first electrode and the second electrode may be substantially the same as a distance between the edge of the first electrode and the edge of the third protective layer.

Surfaces of the first electrode, the second electrode, the second protective layer and the third protective layer may collectively form a cavity.

Each thin film transistor may contact one of a plurality of gate lines extending in one direction and one of a plurality of data lines extending in a direction intersecting the gate lines, and the sensing line may overlap one from among the gate lines and the data lines.

A method of fabricating a display device, which may include sequentially forming a transparent conductive layer and a first protective layer on a first substrate that includes a gate electrode contacting a gate line, a source electrode, and a drain electrode contacting a data line, forming a photoresist pattern on the first protective layer, removing a portion of the first protective layer corresponding to the drain electrode by primary patterning the first protective layer using the photoresist pattern, forming a first electrode by patterning the transparent conductive layer utilizing a dry etching process, exposing the first electrode by secondary patterning the first protective layer, forming a conductive layer contacting the first electrode and positioned on the first protective layer while overlapping the data line, and forming a second electrode contacting the thin film transistor and a second conductive layer arranged on the first conductive layer, by depositing and patterning a transparent conductive material on the first protective layer, wherein the forming a photoresist pattern includes forming a photoresist material film on the first protective layer, and exposing and developing using a half-tone mask including a light-transmitting region overlapping the drain electrode, a semi-light-transmitting region overlapping the data line, and a light-shielding region.

The primary patterning may comprise performing a dry etching process that exposes an area corresponding to the semi-light-transmitting region of the first protective layer.

The patterning the transparent conductive layer may further comprise performing a wet etching process so as to form an undercut in the transparent conductive layer, and so that an edge of the first electrode may be spaced apart from an edge of the first protective layer.

The method may further includes forming the first substrate, wherein the forming the first substrate comprises forming the thin film transistor to include the gate electrode contacting the gate line on a base substrate, the source electrode and the drain electrode contacting a data line, sequentially forming a second protective layer and a third protective layer covering the thin film transistor, and exposing the drain electrode by patterning the second protective layer and the third protective layer.

The exposing the drain electrode may include irradiating light on the third protective layer via the half tone mask, the half tone mask positioned so that the light-transmitting region overlaps the drain electrode and the semi-light-transmitting area is arranged between the light-transmitting region and the light-shielding region, exposing the second protective layer by removing an exposed area of the third protective layer, and patterning the second protective layer.

DETAILED DESCRIPTION

Hereinafter, exemplary embodiments of the present disclosure will be described in detail with reference to the accompanying drawings. The various Figures are not necessarily to scale. All numerical values are approximate, and may vary. All examples of specific materials and compositions are to be taken as nonlimiting and exemplary only. Other suitable materials and compositions may be used instead.

Figure 1:
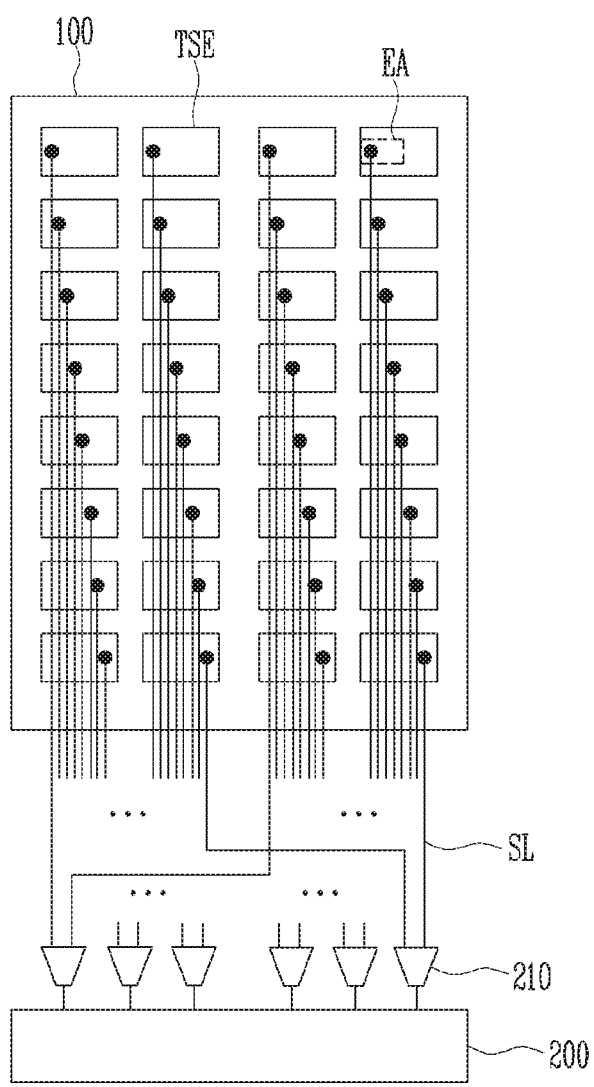
FIG. 1 is a plan view illustrating a display device according to an embodiment of the present disclosure.

FIG. 1 is a plan view illustrating a display device according to an embodiment of the present disclosure.

Referring to FIG. 1, the display device may include a display panel 100 and a touch driver 200.

The display panel 100 may include a touch screen (not shown), and the touch screen may detect a touch position of a user. The display panel 100 may include a first substrate (not shown), a second substrate (not shown), and a plurality of display elements arranged between the first substrate and the second substrate. One of the first substrate and the second substrate may include a plurality of gate lines, a plurality of data lines intersecting the gate lines, and a plurality of thin film transistors contacted to the gate lines and the data lines. Each element may contact one of the thin film transistors. Such display panel configurations are known.

The display elements may be one of a liquid crystal display element, an electrophoretic display element, an electro-wetting display element, and an organic light emitting display element. Although not intended as limiting, in the present disclosure, for the convenience of explanation, the display device is exemplified as a liquid crystal display element. In addition, although not shown in the drawings, the display element of the present disclosure may display an image by using light provided from a backlight unit.

The display elements may include a first electrode, a second electrode, and an optical layer for transmitting light by an electric field generated by the first electrode and the second electrode. The optical layer may be a liquid crystal layer including a plurality of liquid crystal molecules.

One of the first and second electrodes, for example the second electrode, may contact the thin film transistor and receive a driving signal.

The other of the first and second electrodes, for example the first electrode, may receive a common voltage to generate an electric field together with the second electrode. In addition, the first electrode may include a plurality of electrode patterns patterned to cover a plurality of pixel areas. The display elements may be arranged in the pixel areas, respectively. Furthermore, the electrode patterns may be sensing electrodes TSE of the touch screen. That is, the first electrode may include a plurality of sensing electrodes TSE.

The sensing electrodes TSE may have a polygonal shape, for example a square shape. Further, the sensing electrodes TSE may contact the touch driver 200 through sensing lines SL. Accordingly, the sensing electrodes TSE may detect the touch position of the user when a touch scan signal is applied through the sensing lines SL.

The sensing lines SL may transmit the touch scan signal applied from the touch driver 200 to the sensing electrodes TSE. Further, the sensing lines SL may transmit a touch sensing signal provided from the sensing electrodes TSE, for example a change in capacitance, to the touch driver 200.

The touch driver 200 may generate the touch scan signal for detecting the touch, and transmit the signal to the sensing electrodes TSE. A switching unit 210 arranged between the touch driver 200 and the display panel 100 may switch the touch scan signal transmitted to the sensing electrodes TSE, so as to transmit it to any desired sensing electrode TSE.

Figure 2:
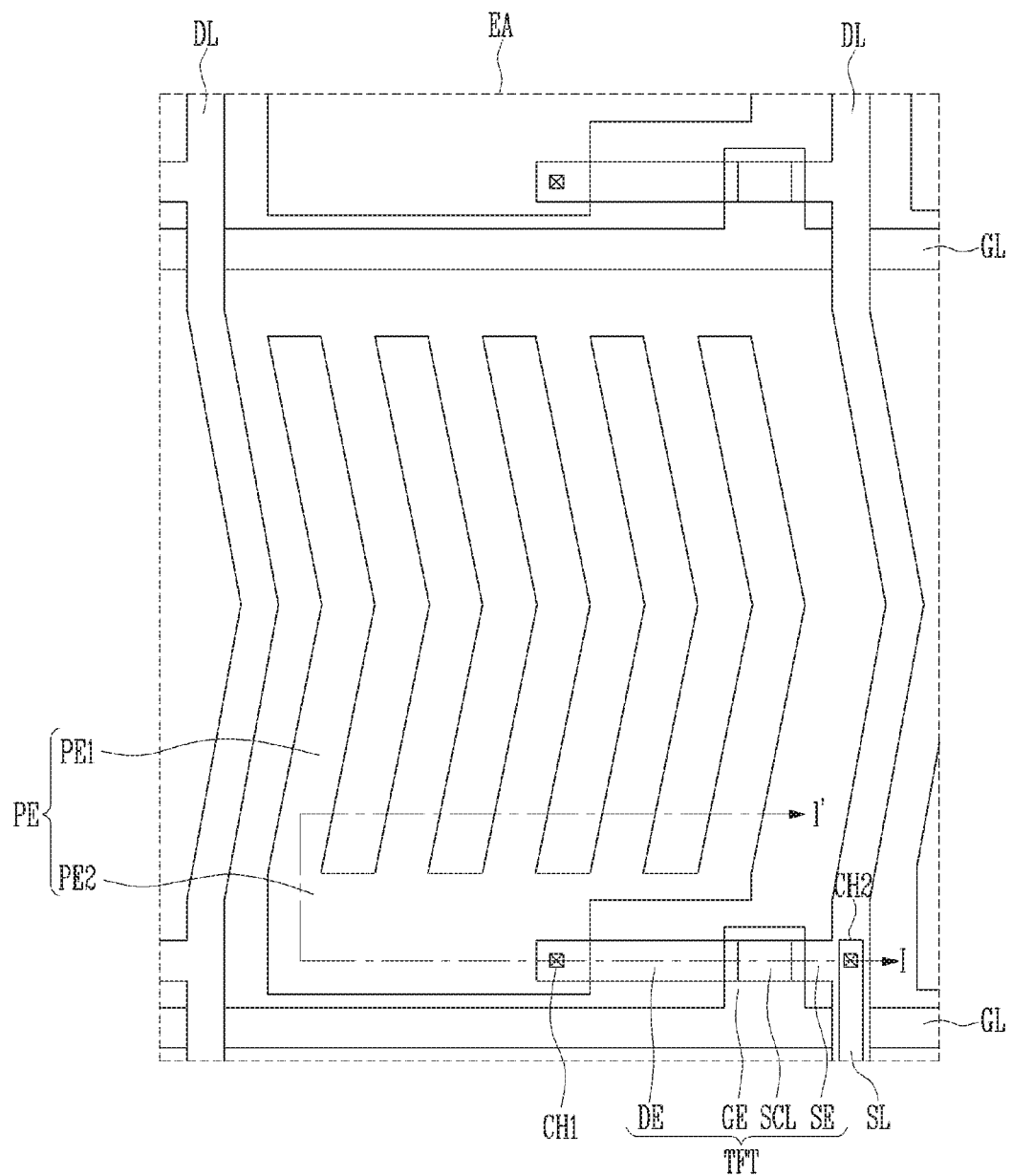
FIG. 2 is an enlarged plan view illustrating area EA of FIG. 1.
Figure 3:
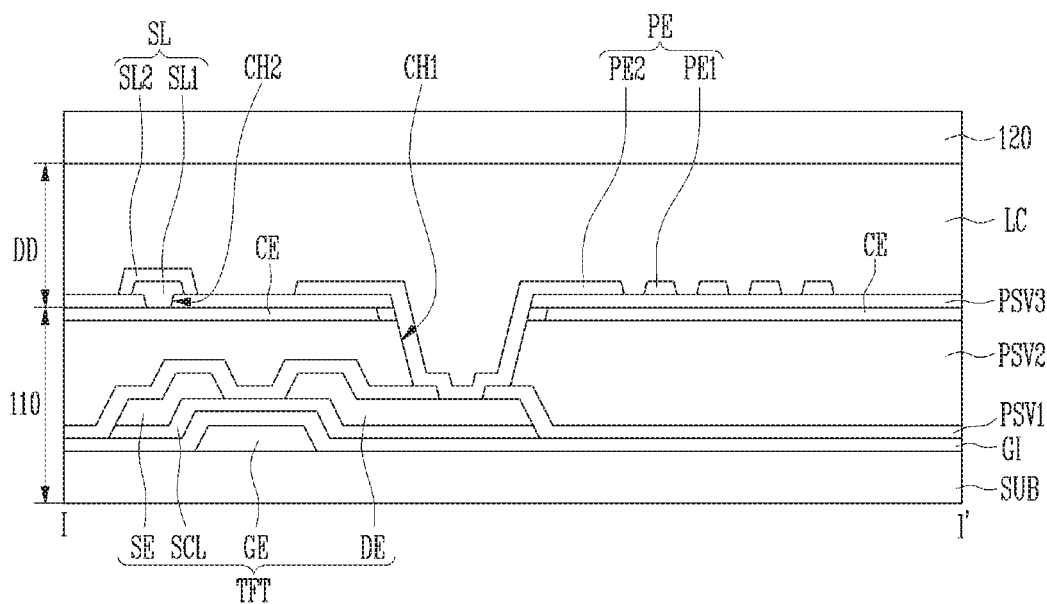
FIG. 3 is a cross-sectional view taken along line I-I' of FIG. 2.
Figure 4:
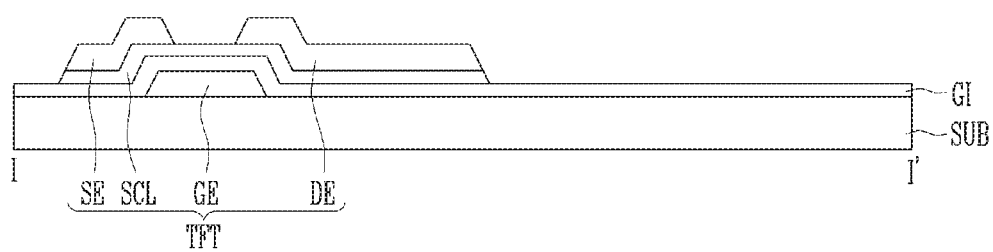
FIGS. 4, 5, 6, 7, 8, 9, 10, 11, 12, 13 and 14 are process cross-sectional views illustrating a method of fabricating a display device such as that shown in FIGS. 1 to 3.

FIG. 2 is an enlarged plan view illustrating area EA of FIG. 1, and FIG. 3 is a cross-sectional view taken along line I-I' of FIG. 2.

Referring to FIGS. 1 to 3, the display panel 100 may include a first substrate 110, a second substrate 120 facing the first substrate 110, and a display device DD arranged between the first substrate 110 and the second substrate 120.

The first substrate 110 may include a base substrate SUB including the plurality of pixel areas, at least one thin film transistor TFT arranged on the base substrate SUB at each pixel area, and a sequential stack of a first protective layer PSV1 and a second protective layer PSV2 on the thin film transistor TFT. The thin film transistor TFT may be connected to the display device DD, as shown.

Materials employed for the base substrate SUB may preferably have a resistance or a heat resistance against high processing temperatures during a manufacturing process.

The base substrate SUB may be capable of transmitting light, and may thus include a transparent insulating material. In addition, the base substrate SUB may be a rigid substrate or a flexible substrate. The rigid substrate may be one of a glass substrate, a quartz substrate, a glass ceramic substrate and a crystalline glass substrate. The flexible substrate may be one of a film substrate and a plastic substrate including a polymer organic material. Further, the flexible substrate may be a fiber glass reinforced plastic (FRP) substrate.

The thin film transistor TFT may be connected to a gate line GL and a data line DL. The thin film transistor TFT may include a gate electrode GE, a semiconductor film SCL, a source electrode SE and a drain electrode DE.

The gate electrode GE may contact the gate line GL. The gate line GL and the gate electrode GE may be arranged on the base substrate SUB. An insulating layer (not shown) may be arranged among the gate line GL, the gate electrode GE and the base substrate SUB.

A gate insulating layer GI may be arranged on the gate line GL and the gate electrode GE, thereby insulating the gate electrode GE from the semiconductor film SCL. That is, the gate insulating layer GI may be arranged among the gate line GL, the gate electrode GE and the semiconductor film SCL. The gate insulating layer GI may include at least one of silicon oxide (SiOx) and silicon nitride (SiNx). For example, the gate insulating layer GI may have a stacked structure of a silicon oxide film and a silicon nitride film.

The semiconductor film SCL may be arranged on the gate insulating layer GI, and a portion of the semiconductor film SCL may overlap the gate electrode GE. An area of the semiconductor film SCL contacting the source electrode SE and the drain electrode DE may be a source area or a drain area in which impurities are doped or injected. An area between the source area and the drain area may be a channel area. In addition, the semiconductor film SCL may include one of amorphous silicon (a-Si), polycrystalline silicon (p-Si), an oxide semiconductor and an organic semiconductor. The oxide semiconductor may include at least one of Zn, In, Ga, Sn, and mixtures thereof. For example, the oxide semiconductor may include an indium-gallium-zinc oxide (IGZO).

The source electrode SE may contact one side of the semiconductor film SCL. In addition, the source electrode SE may contact the data line DL. The drain electrode DE may contact the other side of the semiconductor film SCL while being arranged to be spaced apart from the source electrode SE.

The thin film transistor TFT is shown as being constructed with a bottom gate structure in which the gate electrode GE of the thin film transistor TFT is arranged in a lower portion of the semiconductor film SCL, but the present disclosure is not limited thereto. For example, the thin film transistor TFT may be formed with a top gate structure in which the gate electrode GE is arranged in an upper portion of the semiconductor film SCL.

The first protective layer PSV1 may be arranged on the thin film transistor TFT. The first protective layer PSV1 may cover the thin film transistor TFT. The first protective layer PSV1 may include at least one of silicon nitride and silicon oxide. For example, the first protective layer PSV1 may include a silicon nitride film and a silicon oxide film disposed on the silicon nitride film.

The second protective layer PSV2 may be arranged on the first protective layer PSV1. The second protective layer PSV2 may include a transparent organic insulating material. For example, the second protective layer PSV2 may include at least one of acrylic resin, epoxy resin, phenolic resin, polyamide resin, polyimide resin, unsaturated polyester resin, poly-phenylene ether resin, poly-phenylene sulfide resin, and benzocyclobutene resin.

Alternatively, the second protective layer PSV2 may include a dye or a pigment dispersed in the organic insulating material. When the second protective layer PSV2 includes the dye or the pigment, the second protective layer PSV2 may be used as a color filter. For example, depending on the color of the dye or the pigment, the color of the second protective layer PSV2 may be one of red, green, blue, cyan, magenta, and yellow.

The display device DD may be arranged on the second protective layer PSV2. The display device DD may include a first electrode CE arranged on the second protective layer PSV2, a third protective layer PSV3 arranged on the first electrode CE, a second electrode PE arranged on the third protective layer PSV3 and contacting the drain electrode DE through a first contact hole CH1, and an optical layer LC that transmits or blocks the light by an electric field generated between the first electrode CE and the second electrode PE.

The first electrode CE may include a transparent conductive oxide material. For example, the first electrode CE may include one of indium tin oxide (ITO) and indium zinc oxide (IZO). The common voltage may be applied to the first electrode CE. Thus, the first electrode CE may operate as the common electrode for driving the liquid crystal molecules together with the second electrode PE.

As illustrated in FIG. 1, the first electrode CE may be the sensing electrode TSE connected to the touch driver 200. That is, the first electrode CE may operate as the sensing electrode detecting the touch position of the user when the touch scan signal is applied.

The first electrode CE may have an undercut shape beneath openings in third protective layer PSV3. For example, an area of the first electrode CE may be smaller than that of the second electrode PE. In addition, an edge of the first electrode CE and an edge of the third protective layer PSV3 may be spaced apart from each other.

The third protective layer PSV3 may have the same material as the first protective layer PSV1. For example, the third protective layer PSV3 may include a silicon nitride film and a silicon oxide film disposed on a silicon nitride film.

The second electrode PE may be arranged on the third protective layer PSV3. When the signal is applied through the thin film transistor TFT, the second electrode PE may operate as a pixel electrode for driving the liquid crystal molecules together with the first electrode CE. The second electrode PE may have the same material as the first electrode CE. That is, the second electrode PE may include at least one of indium tin oxide (ITO) and indium zinc oxide (IZO). In addition, the second electrode PE may include a plurality of branch units PE1 and a connecting unit PE2 that connects the branch units PE1 to one another. The connecting unit PE2 may contact the drain electrode DE via the first contact hole CH1 which extends through the first protective layer PSV1, the second protective layer PSV2, and the third protective layer PSV3.

The second electrode PE may be disposed on a sidewall of the second protective layer PSV2 which is exposed by the first contact hole CH1. That is, the second electrode PE may extend along the sidewall of the second protective layer PSV2 which is exposed by the first contact hole CH1.

A distance between the first electrode CE and the second electrode PE may be substantially the same as a distance between the edge of the first electrode CE and the edge of the third protective layer PSV3.

In addition, edges of the first electrode CE are recessed inward, or offset, from a side of second electrode PE at the first contact hole CH1. Therefore, the first electrode CE and the second electrode PE may be spaced apart from each other, and not electrically connected to (i.e. electrically insulated or isolated from) each other.

On the other hand, the sensing line SL may be arranged on a portion of the third protective layer PSV3. The sensing line SL may extend in parallel with one of the gate line GL and the data line DL. For example, the sensing line SL may extend substantially in parallel with the data line DL. In addition, the sensing line SL may overlap the data line DL. Accordingly, since the sensing line SL is arranged in an area in which the light is not transmitted in the display panel 100, reduction of an aperture ratio of the display panel 100 may be prevented.

The first protective layer PSV1, the second protective layer PSV2 and the third protective layer PSV3 may be arranged between the sensing line SL and the data line DL. That is, the sensing line SL and the data line DL may be spaced apart from each other by the first protective layer PSV1, the second protective layer PSV2 and the third protective layer PSV3. Since the second protective layer PSV2 includes a transparent insulating material, the second protective layer PSV2 may be formed to be thick. Accordingly, a parasitic capacitance may be not generated between the sensing line SL and the data line DL.

In addition, the sensing line SL may include a first conductive layer SL1 arranged on the third protective layer PSV3, and a second conductive layer SL2 arranged on the first conductive layer SL1. The first conductive layer SL1 may contact the first electrode CE through a second contact hole CH2 penetrating the third protective layer PSV3. Further, the first conductive layer SL1 may include a conductive metal material. The second conductive layer SL2 may cover the first conductive layer SL1. In addition, the second conductive layer SL2 may have the same material as the second electrode PE.

The optical layer LC may be arranged on the second electrode PE. The optical layer LC may be the liquid crystal film including a plurality of liquid crystal molecules. Accordingly, the optical layer LC may transmit or block light according to the electric field generated by the first electrode CE and the second electrode PE.

The second substrate 120 may face the first substrate 110 and be attached thereto through a sealant. The second substrate 120 may include the same material as the base substrate SUB.

Alternatively, when the second protective layer PSV2 only includes a transparent organic insulating material, a color filter and a black matrix may be arranged on a surface of the second substrate 120 facing the first substrate 110.

Referring to FIGS. 4 to 14, a method of fabricating a display device will be described.

FIGS. 4 to 14 are process cross-sectional views illustrating a method of fabricating a display device shown in FIGS. 1 to 3.

The first substrate 110 may be manufactured or otherwise prepared for use in this fabrication method. The first substrate 110 may include a sequential stack of the first protective layer PSV1 and the second protective layer PSV2 arranged on the base substrate SUB comprising the plurality of pixel areas, at least one thin film transistor TFT arranged on the base substrate SUB at each pixel area, and the first protective layer PSV1.

The base substrate SUB may be capable of transmitting light and thus may include a transparent insulating material. In addition, the base substrate SUB may be a rigid substrate or a flexible substrate.

The thin film transistor TFT may be connected to the gate line GL and the data line DL. The thin film transistor TFT may include the gate electrode GE, the semiconductor film SCL, the source electrode SE and the drain electrode DE.

The thin film transistor TFT may be formed as below.

The gate electrode GE and the gate line GL may be formed on the base substrate SUB by applying and patterning a conductive material. The gate electrode GE may be arranged at the pixel area, and the gate line GL may have a shape extending in a direction of one substrate side, at an area between the pixel areas. In addition, the gate electrode GE may be a protrusion from the gate line GL.

After forming the gate electrode GE and the gate line GL, the gate insulating layer GI may be generated or deposited to cover the gate electrode GE and the gate line GL. The gate insulating layer GI may include at least one of silicon oxide (SiOx) and silicon nitride (SiNx). For example, the gate insulating layer GI may have a stack structure of a silicon oxide film and a silicon nitride film.

After generating the gate insulating layer GI, a semiconductor material film including a semiconductor material may be formed on the gate insulating layer GI. The semiconductor film SCL may be formed by patterning the semiconductor material film. The semiconductor film SCL may include one of amorphous silicon (a-Si), polycrystalline silicon (p-Si), an oxide semiconductor and an organic semiconductor.

After forming the semiconductor film SCL, a conductive layer may be formed by applying a conductive material on the semiconductor film SCL. Subsequently, the source electrode SE and the drain electrode DE may be formed by patterning the conductive layer.

The source electrode SE and the drain electrode DE may respectively contact both ends of the semiconductor film SCL. In addition, the source electrode SE may contact the data line DL.

To the above described process forms the source electrode SE and the drain electrode DE after forming the semiconductor film SCL, but the present disclosure is not limited thereto. For example, after sequentially forming the semiconductor material film and the conductive material film on the gate insulating layer GI, the semiconductor film SCL, the source electrode SE, and the drain electrode DE may be formed by performing a photolithography process using a single exposure mask, for example a half-tone mask.

Figure 5:
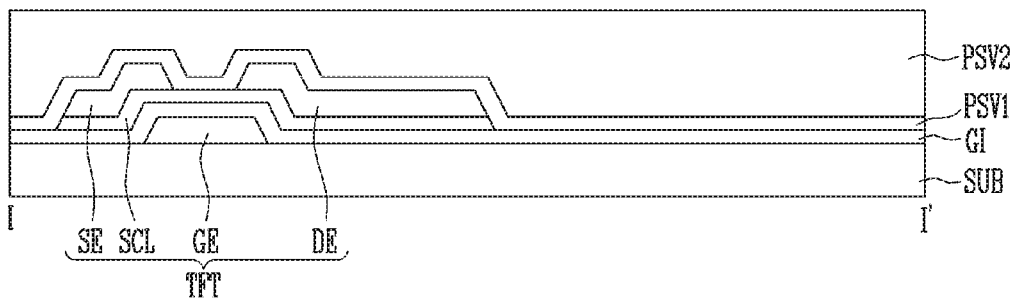

Referring to FIG. 5, after manufacturing the thin film transistor TFT, the first protective layer PSV1 may be formed on the thin film transistor TFT. The first protective layer PSV1 may cover the thin film transistor TFT. The first protective layer PSV1 may include one of silicon nitride and silicon oxide. For example, the first protective layer PSV1 may include a silicon nitride film, and a silicon oxide film disposed on the silicon nitride film.

After forming the first protective layer PSV1, the second protective layer PSV2 may be formed on the first protective layer PSV1. The second protective layer PSV2 may include a transparent organic insulating material. For example, the second protective layer PSV2 may include at least one of acrylic resin, epoxy resin, phenolic resin, polyamide resin, polyimide resin, unsaturated polyester resin, poly-phenylene ether resin, poly-phenylene sulfide resin, and benzocyclobutene resin.

In addition, the second protective layer PSV2 may include a photoresist. Accordingly, the second protective layer PSV2 may have an area of high solubility in developing solution and an area of low solubility in the developing solution.

On the other hand, the second protective layer PSV2 may include a dye or a pigment dispersed in the organic insulating material. When the second protective layer PSV2 includes a dye or pigment, the second protective layer PSV2 may be used as a color filter. For example, according to the color of the dye or the pigment, the color of the second protective layer PSV2 may be one of red, green, blue, cyan, magenta, and yellow.

Figure 6:
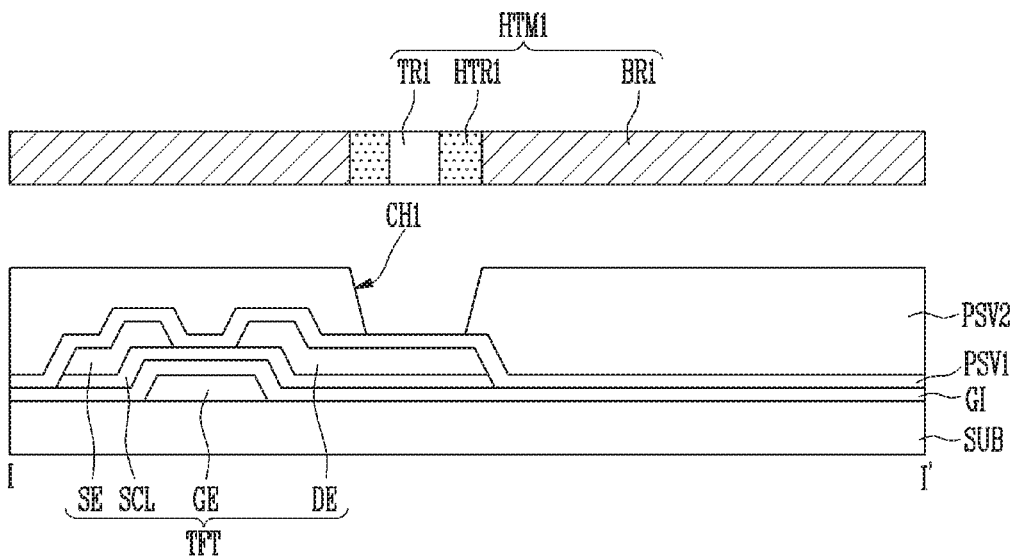

Referring to FIG. 6, after forming the second protective layer PSV2, a portion of the first protective layer PSV1 overlying part of the drain electrode DE may be exposed by performing an exposure process and a development process using a first halftone mask HTM1.

The first half-tone mask HTM1 may include a first light transmitting region TR1, a first semi-light-transmitting region HTR1 and a first light-shielding region BR1. The first light-transmitting region TR1 may be capable of transmitting light, and may overlap a portion of the drain electrode DE.

The first semi-light-transmitting region HTR1 may be disposed between the first light-transmitting region TR1 and the first light-shielding region BR1. The amount of light transmitted by the first semi-light-transmitting region HTR1 may be less than the amount of light transmitted by the first light-transmitting region TR1. In addition, the amount of light transmitted by the first semi-light-transmitting region HTR1 may be greater than the amount of light transmitted by the first light-shielding region BR1. The amount of light transmitted by the first light-shielding region BR1 may be close to 0 (zero).

In the exposure process, light may be irradiated on the second protective layer PSV2 via transmission through the first light-transmitting region TR1 and the first semi-light-transmitting region HTR1 of the first half-tone mask HTM1. A depth to which light passing through the first light-transmitting region TR1 penetrates into the second protective layer PSV2 may be greater than a depth to which light passing through the first semi-light-transmitting region HTR1 penetrates into the second protective layer PSV2. Thus, in the second protective layer PSV2, a depth of the area exposed by the first light-transmitting region TR1 may be greater than a depth of the area exposed by the first semi-light-transmitting region HTR1.

In the second protective layer PSV2, the solubility in the developing solution of the area exposed by the first light-transmitting area TR1 and the first semi light-transmitting area HTR1 may be greater than the solubility in the developing solution of the area which is not exposed.

In the developing process, the area exposed by the first light-transmitting region TR1 and the first semi-light-transmitting area HTR1 in the second protective layer PSV2 may then be removed by the developing solution. Thus, an area of the second protective layer PSV2 that corresponds to the first light-transmitting region TR1 may be entirely removed, and an area of the second protective layer PSV2 that corresponds to the first semi-light-transmitting region HTR1 may partially remain.

Figure 7:
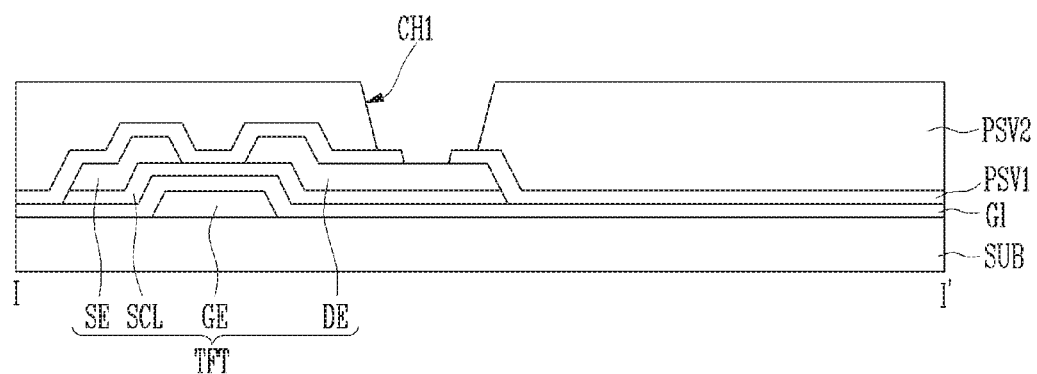

Referring to FIG. 7, after exposing the first protective layer PSV1 above the upper portion of the drain electrode DE, the first contact hole CH1 exposing the drain electrode DE may be formed by etching the first protective layer PSV1 using the second protective layer PSV2 as a mask.

The etching of the first protective layer PSV1 may be performed by, for example, utilizing a dry etching process. The first protective layer PSV1 may be degraded by the dry etching process. Specifically, due to the dry etching process, an area corresponding to first light-transmitting region TR1 of the first protective layer PSV1 may be removed.

The first half-tone mask HTM1 may be used to form the first contact hole CH1. Thus, the forming of the first contact hole CH1 by using a single half-tone mask HTM1 may be more easily performed than the forming of contact holes by patterning the respective first protective layer and second protective layer PSV1 and PSV2 using two different exposure masks.

After forming the first contact hole CH1, the display element DD may be formed on the second protective layer PSV2 to be electrically connected to the drain electrode DE. The display device element may include the first electrode CE arranged on the second protective layer PSV2, the third protective layer PSV3 arranged on the first electrode CE, the second electrode PE arranged on the third protective layer PSV3 and connected to the drain electrode DE through the first contact hole CH1, and the optical layer LC transmitting and blocking light by the electric field generated by the first electrode CE and the second electrode PE.

The display element DD may be formed as follows.

Figure 8:
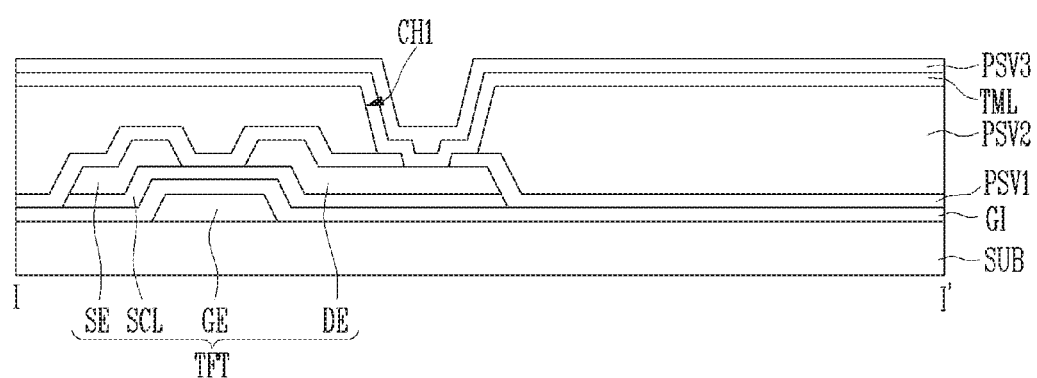

Referring to FIG. 8, after exposing the drain electrode DE, a transparent conductive layer TML including a transparent conductive material may be formed on the second protective layer PSV2. The transparent conductive layer TML may include a single transparent conductive oxide such as one of indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO).

After forming the transparent conductive layer TML, the third protective layer PSV3 may be formed on the transparent conductive layer TML. The third protective layer PSV3 may include the same material as the first protective layer PSV1. For example, the third protective layer PSV3 may include a silicon nitride film, and a silicon oxide film disposed on the silicon nitride film.

Figure 9:
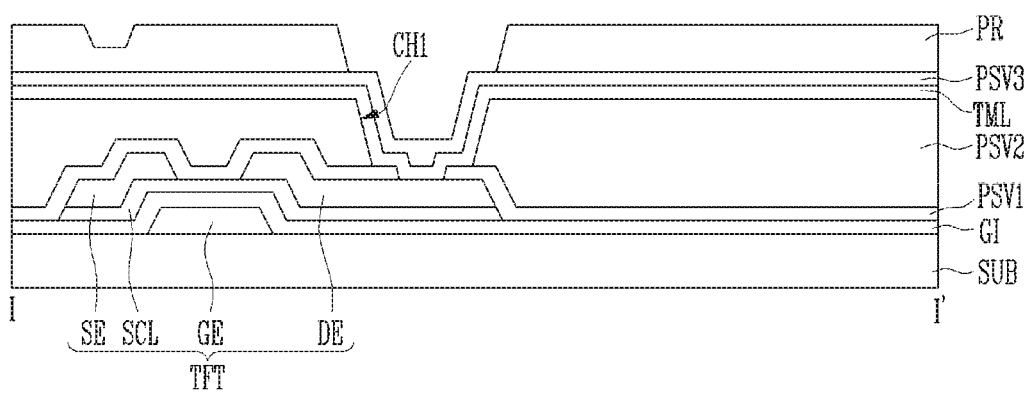

Referring to FIG. 9, after forming the third protective layer PSV3, a photoresist pattern PR may be formed on the third protective layer PSV3.

The photoresist pattern PR may be formed as follows.

A photoresist material film may be formed on the third protective layer PSV3.

Subsequently, through an exposure process using a second half-tone mask HTM2, light may be irradiated on the photoresist material film. The second half-tone mask HTM2 may include a second light-transmitting region TR2, a second semi-light-transmitting region HTR2, and a second light shielding region BR2. The second light-transmitting region TR2 may be arranged to overlap the first contact hole CH1. In addition, the second semi-light-transmitting region HTR2 may be disposed to overlap the data line DL.

Due to the above exposure process, the solubility in the developing solution may increase in a light irradiation area of the photoresist material film.

After performing the exposure process, the photoresist pattern PR may be formed using a developing solution. Through the above developing process, the photoresist material film may be patterned, an area corresponding to the second light-transmitting region TR2 may be opened, and an area corresponding to the second semi-light-transmitting region HTR2 may be formed to have a trench shape.

Figure 10:
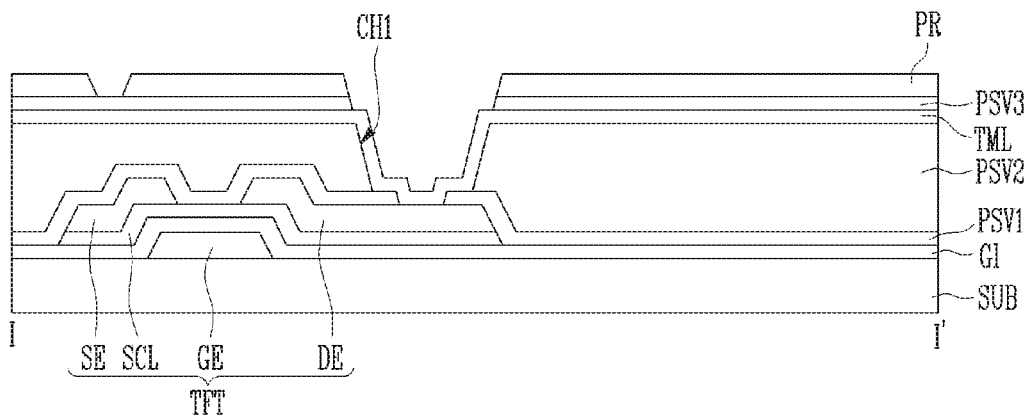

Referring to FIG. 10, after forming the photoresist pattern PR, the third protective layer PSV3 may be first patterned using the photoresist pattern PR as a mask.

In this first patterning, an area corresponding to the first contact hole CH1 of the third protective layer PSV3 may be removed. Therefore, the transparent conductive layer TML corresponding to the first contact hole CH1 may be exposed.

This first, or primary, patterning of the third protective layer PSV3 may be performed by a dry etching process. This dry etching process may degrade the photoresist pattern PR. Specifically, an area corresponding to the second semi-light-transmitting region HTR2 of the photoresist pattern PR may be removed, and the photoresist pattern PR may expose the third protective layer PSV3. That is, an exposed area of the third protective layer PSV3 may correspond to the second semi-light-transmitting region HTR2.

Figure 11:
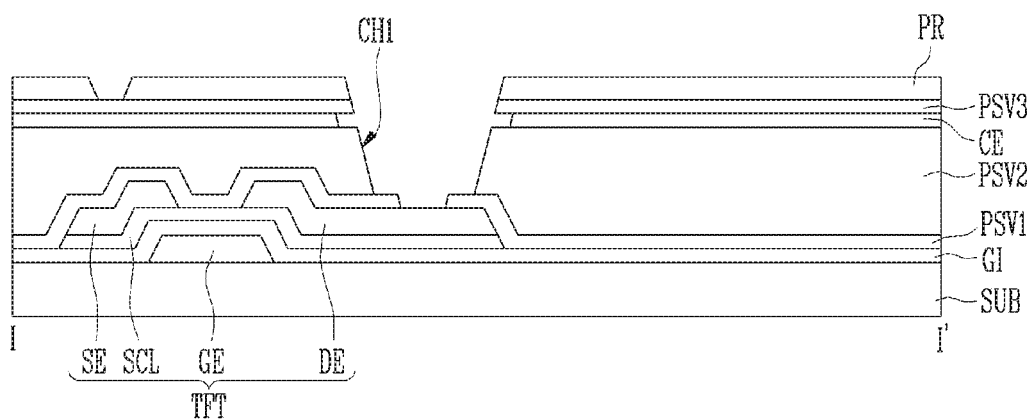

Referring to FIG. 11, after primary patterning of the third protective layer PSV3 and secondary patterning of the transparent conductive layer TML, the first electrode CE of the display element DD may be formed.

The patterning of the transparent conductive layer TML may be performed by a wet etching process. This wet etching may be an isotropic etching, thereby partially etching the transparent conductive layer TML in the lower portion of the third protective layer PSV3. That is, the first electrode CE may have an undercut shape. Therefore, the area of the first electrode CE may be smaller than the area of the third protective layer PSV3, i.e. the opening in the first electrode CE may be larger than the opening of the third protective layer PSV3.

In addition, in this configuration, the first electrode CE may function as the sensing electrode TSE that overlaps a plurality of pixel areas shown in FIG. 1.

Figure 12:
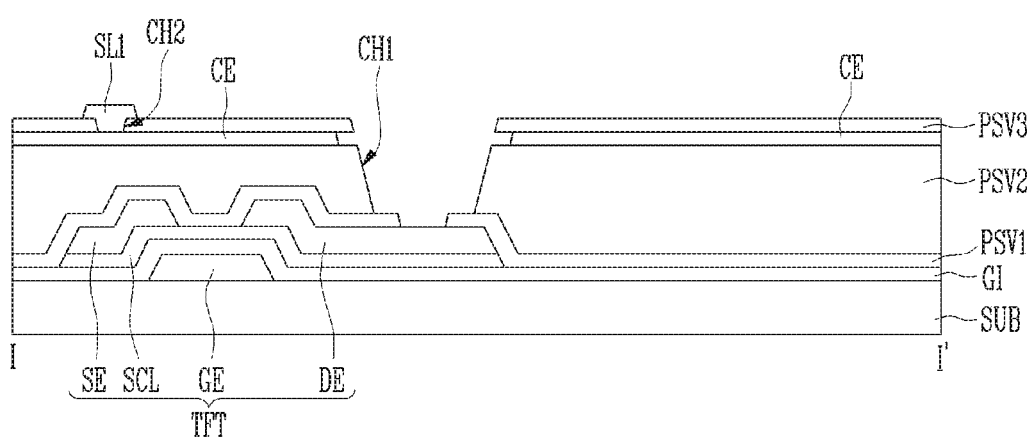

Referring to FIG. 12, after forming the first electrode CE, the third protective layer PSV3 may be secondarily patterned by using the photoresist pattern PR as a mask. The secondary patterning of the third protective layer PSV3 may be performed by a dry etching process. Due to this secondary patterning, the third protective layer PSV3 exposed by the photoresist pattern PR may be etched, thereby forming the second contact hole CH2 exposing the first electrode CE.

The second contact hole CH2 may be disposed corresponding to the second semi-light-transmitting region HTR2.

In the above procedure, the second half-tone mask may be used for primary patterning of third protective layer PSV3, forming the first electrode CE, and secondary patterning of the third protective layer PSV3. Thus, the process that uses the second half-tone mask HTM2 may be more easily performed than patterning of the third protective layer PSV3 after forming the first electrode CE.

After forming the second contact hole CH2, the photoresist pattern PR may be removed.

After removing the photoresist pattern PR, a first conductive layer SL1 of the sensing line SL may be formed by depositing and patterning a conductive metal material on the third protective layer PSV3. The first conductive layer SL1 may contact the first electrode CE through the second contact hole CH2. The first conductive layer SL1 may extend substantially in parallel with the data line DL. In addition, the first conductive layer SL1 may overlap the data line DL.

Figure 13:
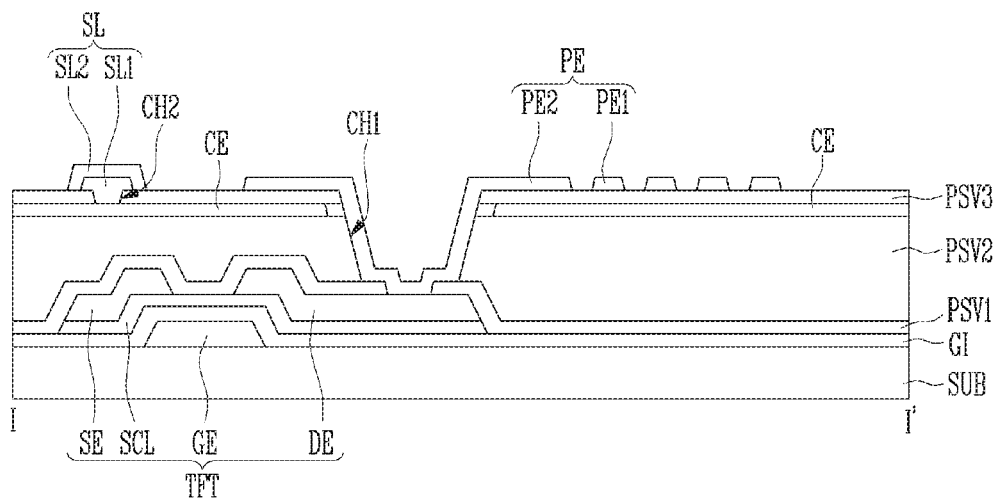

Referring to FIG. 13, after forming the first conductive layer SL1, the second electrode PE of the display element DD and a second conductive layer SL2 of the sensing line SL may be formed by depositing and patterning transparent conductive material on the first conductive layer SL1 and the third protective layer PSV3.

The second electrode PE may include a plurality of branch units PE1 and the connecting unit PE2 connecting the branch units PE1 to one another. The connecting units PE may contact the drain electrode DE through the first contact hole CH1 penetrating the first protective layer PSV1, the second protective layer PSV2 and the third protective layer PSV3.

The second conductive layer SL2 may cover the first conductive layer SL1. In addition, the second conductive layer SL2 may include the same material as the second electrode PE.

Figure 14:
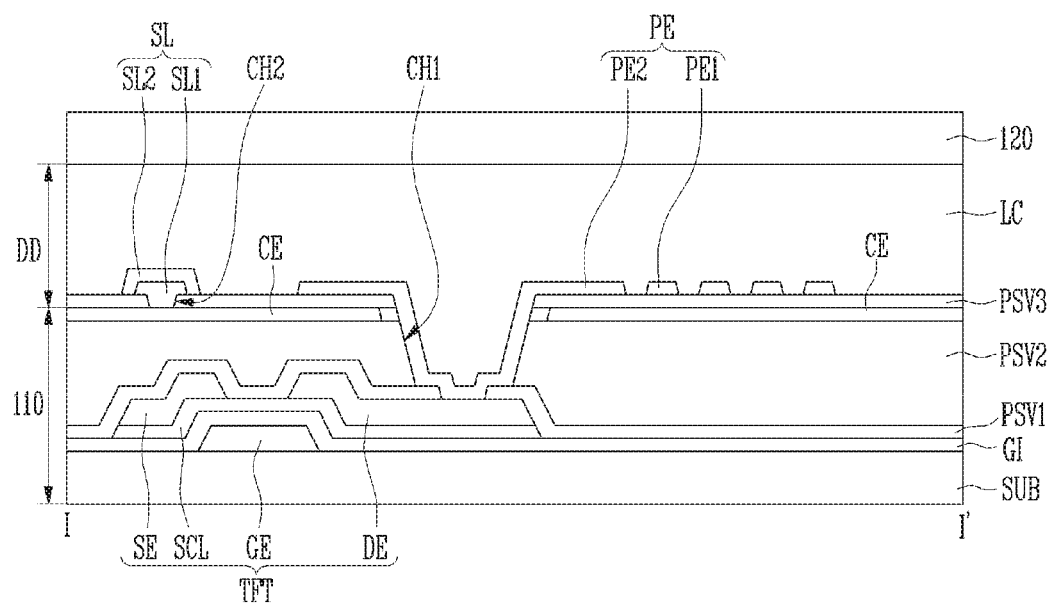

Referring to FIG. 14, the optical layer LC may be disposed on the second electrode PE. The optical layer LC may be a liquid crystal layer including a plurality of liquid crystal molecules. Thus, the optical layer LC may transmit or block light by an electric field generated by the first electrode CE and the second electrode PE.

After arranging the optical layer LC on the second electrode PE, the second substrate 120 may be arranged on the optical layer LC. The second substrate 120 may then be attached to the first substrate 110.

The second substrate 120 may face the first substrate 110 and may include the same material as the base substrate SUB. When the second protective layer PSV2 only includes a transparent organic insulating material, the color filter and the black matrix may be arranged on the surface of the second substrate 120 that faces the first substrate 110.

Above described embodiments attach the first substrate 110 and the second substrate 120 after arranging the optical layer LC, but the present disclosure is not limited thereto. For example, after attaching the first substrate 110 to the second substrate 120, the optical layer LC may be injected into a space between the first substrate 110 and the second substrate 120.

As described above, the display device may include elements constituting a touch screen. In addition, since one of the display device elements may be the sensing electrode, a separate touch screen panel is not needed, which is advantageous for slimming of the display device.

In addition, since in the fabrication of the display device, a half-tone mask is used a plurality of times, manufacturing cost may be reduced by lowering the number of exposure masks.

While embodiments are described with reference to the accompanying drawings, it is to be understood that various changes and modifications may be made in the disclosure without departing from the spirit and scope thereof. Further, it should be understood that the disclosure is not limited to the specific embodiments thereof, and various changes, equivalences and substitutions may be made without departing from the scope and spirit of the disclosure. Therefore, the technical range of the present disclosure is not limited to the detailed description of the specification but defined by the range of the claims. Further, the present disclosure may be embodied in different forms and should not be construed as limited to the embodiments set forth herein. Various features of the above described and other embodiments can be mixed and matched in any manner, to produce further embodiments consistent with the invention.

What is claimed is:

1. A display device, comprising:
a first substrate including a base substrate comprising a plurality of pixel areas, a thin film transistor arranged at each pixel area on the base substrate, a first protective layer arranged on the thin film transistors, and a second protective layer arranged on the first protective layer;
a second substrate facing the first substrate;
a display element including a first electrode arranged on the second protective layer, a third protective layer arranged on the first electrode, a second electrode arranged on the third protective layer at one of the pixel areas and contacting the corresponding thin film transistor, through a first contact hole and an optical layer configured to selectively transmit and block light by an electric field generated by the first electrode and the second electrode, the optical layer arranged between the first substrate and the second substrate; and
a sensing line arranged on the third protective layer and contacting the first electrode through a second contact hole,
wherein, the sensing line comprises:
a first conductive layer arranged on the third protective layer and contacting the first electrode through the second contact hole; and
a second conductive layer arranged on the first conductive layer,
wherein the second conductive layer includes a same material as the second electrode, and
wherein both of the second conductive layer and the second electrode cover and directly contact the third protective layer.

2. The display device of claim 1, wherein the first conductive layer includes conductive metal material.

3. The display device of claim 2, wherein the second conductive layer covers the first conductive layer.

4. The display device of claim 1, wherein the first electrode has an undercut, so that an edge of the first electrode is spaced apart from an edge of the third protective layer.

5. The display device of claim 4, wherein an area of the first electrode is smaller than an area of the third protective layer.

6. The display device of claim 4, wherein the second electrode extends along a side wall of the first contact hole, and a distance between the first electrode and the second electrode is substantially the same as a distance between the edge of the first electrode and the edge of the third protective layer.

7. The display device of claim 6, wherein surfaces of the second electrode, the first electrode, the second protective layer and the third protective layer collectively form a cavity.

8. The display device of claim 1, wherein each thin film transistor contacts one of a plurality of gate lines extending in one direction and one of a plurality of data lines extending in a direction intersecting the gate lines, and
  the sensing line overlaps one line from among the gate lines and the data lines.

9. The display device of claim 8, wherein the sensing line overlaps one of the data lines.

10. The display device of claim 9, wherein the second contact hole is arranged to overlap one of the data lines.

11. The display device of claim 1, wherein the optical layer includes a plurality of liquid crystal molecules.

* * * * *